US005160872A

United States Patent [19]

Kenji et al.

[11] Patent Number: 5,160,872

[45] Date of Patent: Nov. 3, 1992

[54] FLYBACK TRANSFORMER

[75] Inventors: Naitou Kenji, Kawaguchi; Ohshima Yasuhiro, Yokohama; Nagai Tadao, Kawasaki, all of Japan

[73] Assignee: Murata Mfg. Col, Ltd., Japan

[21] Appl. No.: 744,608

[22] Filed: Aug. 13, 1991

[30] Foreign Application Priority Data

Aug. 13, 1990 [JP] Japan ................................ 2-213927

[51] Int. Cl.[5] ...................... H01J 29/70; G09G 1/04; H05K 5/00

[52] U.S. Cl. .................................. 315/411; 315/382; 361/331; 361/399

[58] Field of Search ....................... 315/402, 399, 411; 335/213; 336/90, 145, 149, 150; 361/399, 395, 419, 331

[56] References Cited

U.S. PATENT DOCUMENTS

| | | | |
|---|---|---|---|
| 4,293,903 | 10/1981 | Mochida et al. | 315/411 |
| 4,402,037 | 8/1983 | Iwamura et al. | 361/423 |
| 4,499,522 | 2/1985 | Nakamura | 361/331 |
| 4,527,229 | 7/1985 | Imamura et al. | 315/411 |

FOREIGN PATENT DOCUMENTS

| | | |
|---|---|---|
| 3334904 | 6/1984 | Fed. Rep. of Germany . |
| 60-018904 | 1/1985 | Japan . |
| 63-285915 | 11/1988 | Japan . |

OTHER PUBLICATIONS

Patent Abstracts of Japan, vol. 13, No. 114 (E-730)[3462] Mar. 20, 1989.

Patent Abstracts of Japan, vol. 9, No. 136 (E-320)[1859], Jun. 12, 1985.

*Primary Examiner*—Gregory C. Issing

*Attorney, Agent, or Firm*—Townsend and Townsend

[57] ABSTRACT

A flyback transformer constituted such that a focus pack incorporating a circuit board having a resistor circuit including a variable resistor for focus voltage supply is mounted on a transformer case, comprising an outer case to be mounted on a transformer case, and an inner frame, formed inside the outer case to be integral with the outer case for incorporating the circuit board, wherein an opening path is formed between the outer case and the inner frame, a shaft hole extending through the opening path is provided for the outer case and the inner frame, the shaft hole is defined from the opening path by an insulating cylinder wall, and a rotational operation shaft for the variable resistor is inserted in a cylinder hole of the insulating cylinder wall.

6 Claims, 6 Drawing Sheets

PRIOR ART

FLYBACK TRANSFORMER

BACKGROUND OF THE INVENTION

1. Field of the Invention

The present invention relates to a flyback transformer having a focus pack.

2. Description of the Prior Art

In a television receiver using a cathode-ray tube, a high voltage is required. For this purpose, a flyback transformer which generates a high voltage by utilizing a flyback pulse is used.

A flyback transformer generates and applies a high voltage (e.g., 25 kV) to the anode of a cathode-ray tube. This high voltage is also appropriately decreased across a resistor to obtain a focus voltage (e.g., 10 kV) to be applied to an electron beam focusing electrode arranged in an electron gun, and a screen voltage (e.g., 1 kV) to be applied to a screen electrode for color adjustment.

Conventionally, in order to obtain a focus voltage and a screen voltage from a high voltage generated by a flyback transformer, a unit called a focus pack is used.

Recently, Japanese Patent Laid-Open No. 2-28905 proposes a flyback transformer having a focus pack. In this apparatus, as shown in FIG. 1, an inner case 3 is fitted inside an outer case 2 to constitute a focus pack 1 as a double case. A circuit board 4, on which a resistor circuit (not shown) including a variable resistor is formed, is housed in the inner case 3. A rotational operation shaft 5 of the variable resistor extends from a shaft retaining cylinder 6 of the inner case 3 to the outside to be freely rotatable. The outer case 2 of this focus pack 1 is fitted on a transformer case 7. In this state, the transformer case 7 is filled with an insulating casting resin 8 to insulate the circuit board 4 by the inner case 3, the insulating casting resin 8, and the outer case 2. As a result, electrical discharge from a high-voltage portion of the circuit board 4 to the outside is prevented. When the rotational operation shaft 5 is rotated, the resistance of the variable resistor is changed, and the level of the focus adjusting voltage output from the circuit board 4 is variably adjusted. Reference numeral 11 denotes a low-voltage coil housed in the transformer case 7; 13, a high-voltage coil; and 15, a core.

Japanese Utility Model Laid-Open No. 2-65304 proposes a focus pack having a double case structure. In this apparatus, as shown in FIG. 2, a focus pack 1 is constituted by outer and inner cases 2 and 3, and shaft retaining cylinders 6 on the inner case 3 side, in which rotational operation shafts 5 for focus and screen adjusting variable resistors extend, are hermetically fitted in the holes in the outer case 2, thereby integrating the cases 2 and 3. In this focus pack 1, the high-voltage portion of a circuit board 4 is insulated by the double case, in the same manner as described above, thereby preventing electrical discharge from the high-voltage portion to the outside.

However, in either focus pack 1 of the double case structure proposed above, the outer and inner cases 2 and 3 are separately formed, and are integrated during assembly by fitting the shaft retaining cylinder 6 of the inner case 3 side into the hole in the outer case 2. Therefore, the outer and inner cases 2 and 3 must be formed in separate steps by using separate molds, and the cases 2 and 3 formed in the separate steps must be integrated by fitting, resulting in cumbersome procedures. As a result, the work efficiency in the manufacture of the apparatus is low, resulting in an increase in cost of the apparatus.

SUMMARY OF THE INVENTION

The present invention has been made to resolve the problems described above, and has as its object to eliminate the cumbersomeness of forming outer and inner cases of a focus pack in separate steps by using separate molds and integrally fitting the outer and inner cases, thereby providing a flyback transformer of a high work efficiency.

In order to achieve this object, the present invention provides a flyback transformer constituted such that a focus pack incorporating a circuit board having a resistor circuit including a variable resistor for focus voltage supply is mounted on a transformer case, comprising an outer case to be mounted on the transformer case, and an inner frame, formed inside the outer case to be integral with the outer case, for incorporating the circuit board, wherein an opening path is formed between the outer case and the inner frame, a shaft hole extending through the opening path is provided for the outer case and the inner frame, the shaft hole is defined from the opening path by an insulating cylinder wall, and a rotational operation shaft for the variable resistor is inserted in a cylinder hole of the insulating cylinder wall.

According to the present invention, the outer case and the inner frame of the focus pack are integrally formed. During this integral formation, the opening path is formed between the outer case and the inner frame. The circuit board having the resistor circuit formed thereon is housed in the inner frame, and the rotational operation shaft of the variable resistor is inserted in the shaft hole defined by the insulating cylinder wall. In this state, the focus pack is mounted on the transformer case, and the transformer case is filled with an insulating casting resin. Then, the insulating casting resin flows into the opening path defined between the outer case and the inner frame, and the circuit board is insulated from the outside by the inner frame, the insulating casting resin, and the outer case.

DETAILED DESCRIPTION OF THE PREFERRED EMBODIMENTS

The preferred embodiments of flyback transformers according to the present invention will be described with reference to the accompanying drawings.

Figure 1:
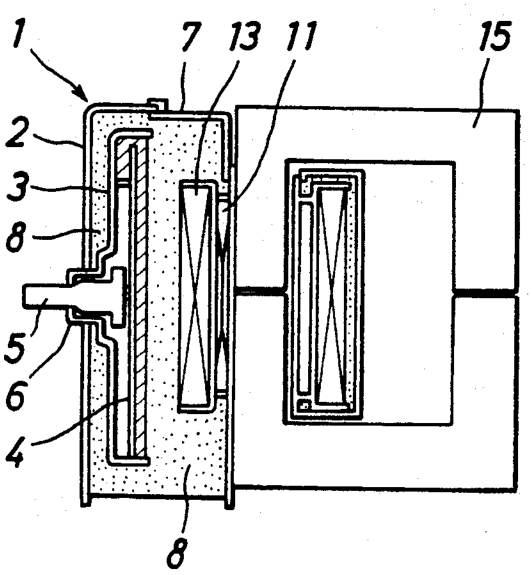
FIG. 1 is a sectional view of an arrangement of a conventional flyback transformer having a focus pack.
Figure 2:
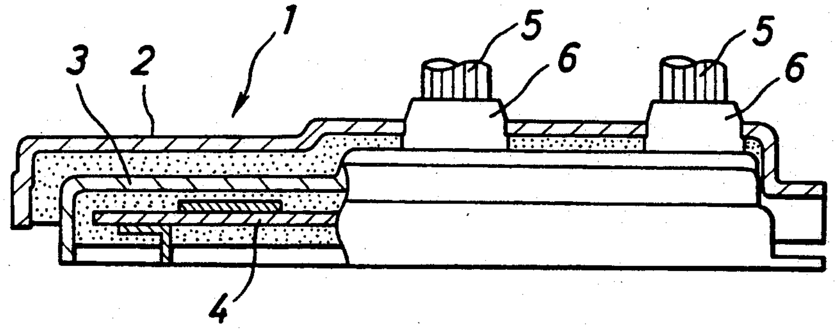
PRIOR ART FIG. 2
FIG. 2 is a partial sectional view of an arrangement of another conventional flyback transformer.
Figure 3:
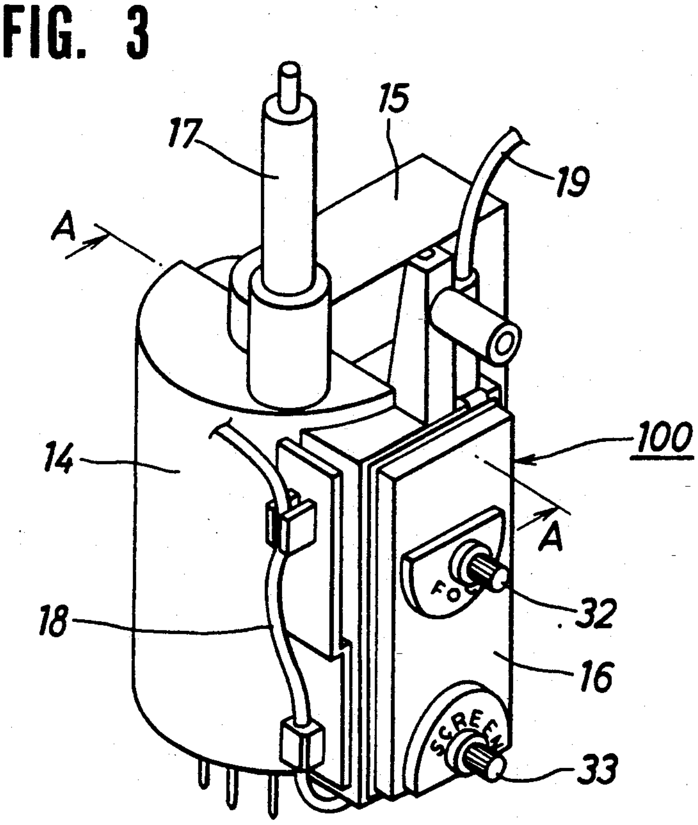
FIG. 3 shows the outer appearance of a flyback transformer according to the present invention.
Figure 4:
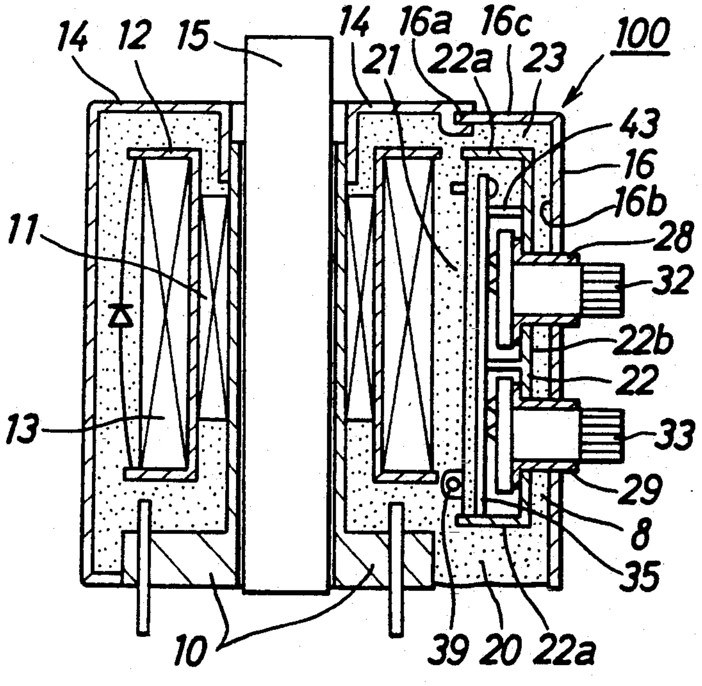
FIG. 4 is a sectional view taken along the line A—A of FIG. 3.

FIG. 3 shows an outer appearance of the flyback transformer according to the present invention, and FIG. 4 is a sectional view taken along the line A—A of FIG. 3.

In a flyback transformer, as is seen from FIG. 4, a low-voltage coil 11 is wound around a low-voltage coil bobbin 10, and a high-voltage coil 13 is wound around a high-voltage coil bobbin 12 arranged around the low-voltage coil 11. This assembly is housed in a transformer case 14, the transformer case 14 is filled with an insulating casting resin 8, and a core 15 is inserted at the center of the low-voltage coil bobbin 10.

As shown in FIG. 3, an outer case 16 of a focus pack 100 is fitted to a portion of the transformer case 14. An anode lead wire 17, to which a high voltage is supplied, extends from the upper portion of the transformer case 14. A screen lead wire 18 and a focus lead wire 19 extend from the lower and upper portions, respectively, of the focus pack 100.

Figure 5:
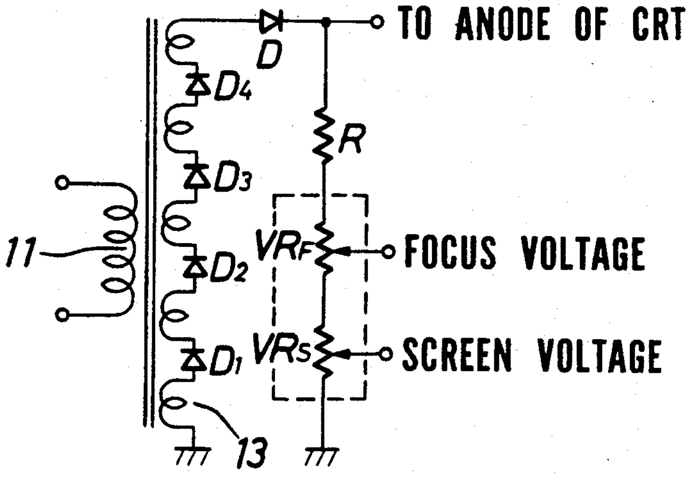
FIG. 5 shows the electrical connection of the flyback transformer.

The electrical connection of the flyback transformer will be described. As shown in FIG. 5, the low- and high-voltage coils 11 and 13 serve as primary and secondary windings, respectively. The high-voltage coil 13 is divided by a plurality of (4 in the case shown in FIG. 5) diodes $D_1$ to $D_4$. The high-voltage terminal of the high-voltage coil 13 is connected to the anode of a television receiver through a diode $D_5$. A stationary resistor R, a variable resistor $VR_F$ for focus voltage adjustment, and a variable resistor $VR_S$ for screen voltage adjustment are connected in series between the high-voltage terminal and ground. The variable resistors $VR_F$ and $VR_S$ surrounded by a broken line are provided on a circuit board 35 to be described later.

Referring back to FIG. 4, the outer case 16 of the focus pack 100 is made of an insulating resin such as a modified polyphenylene oxide and polybutylene terephthalate. A side 20 on the lower side of the outer case 16, and a flat 21 which is side of the outer case 16 are open. The terminal portion of the outer case 16 on the open flat 21 side forms a fitting portion 16*a* to be mounted on the transformer case 14. An inner frame 22 is formed on a bottom 16*b* side of the outer case 16 to be integral with the outer case 16 through a side wall pillar 22*c*.

Figure 11:
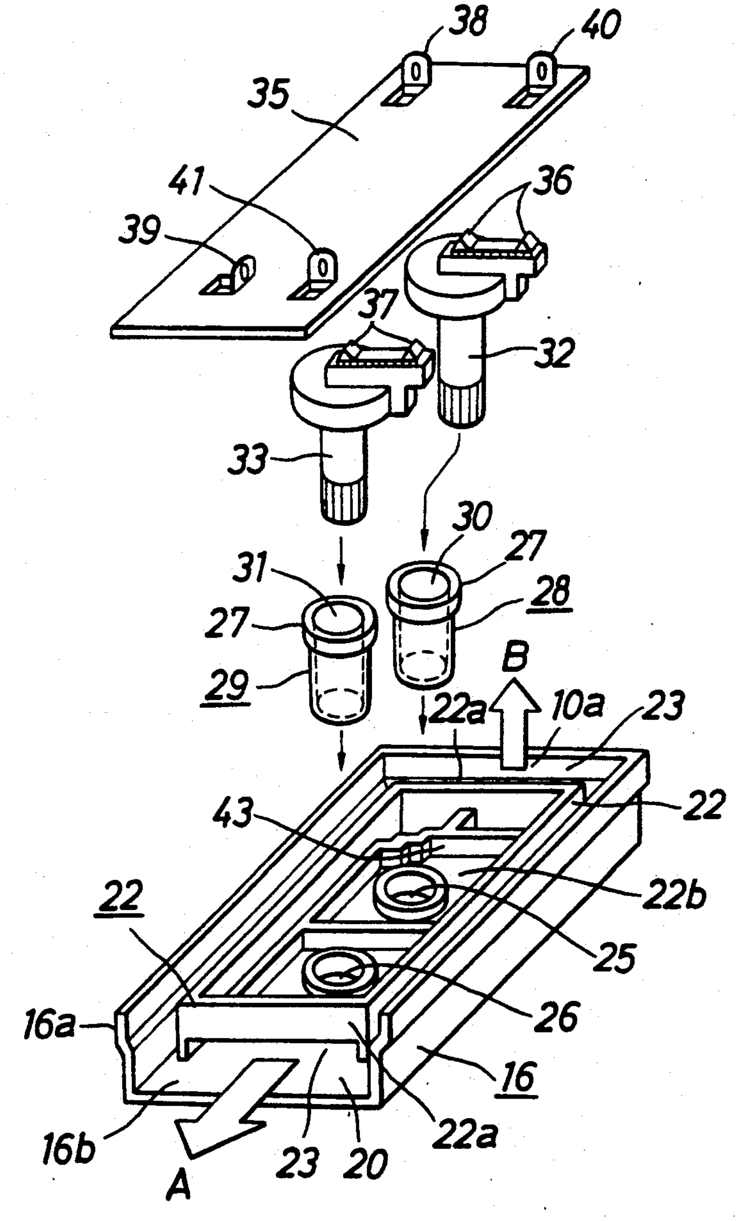
FIG. 11 is an exploded perspective view of an embodiment of the focus pack.
Figure 12:
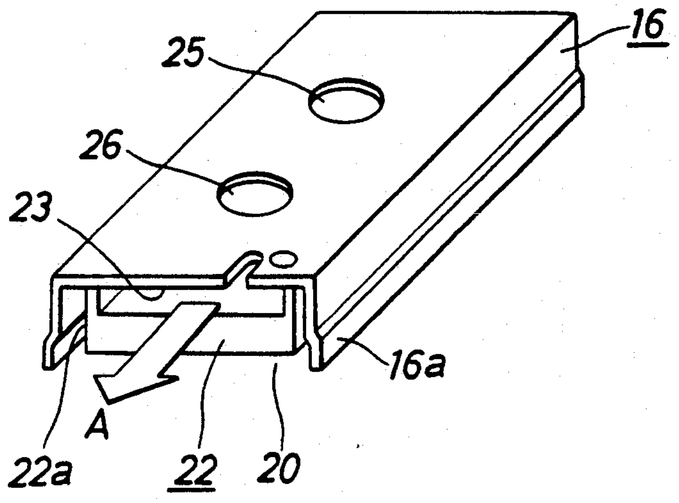
FIG. 12 is a perspective view showing an outer case and an inner frame of the focus pack shown in FIG. 11.

The inner frame 22 has a side wall 22*a* the flat of which is open. An opening path 23 is defined between a bottom 22*b* of the inner frame 22 and the bottom 16*b* of the outer case 16, and between a side wall 16*c* of the outer case 16 on the opposite side of the open side 20 and the side wall 22*a* of the inner frame 22 which is adjacent to the side wall 16*c*. The opening path 23 is continuous from the side wall 16*c* side to the bottom 16*b* side. The opening path 23 is formed in the following manner. Metal frames (not shown) are inserted in the bottom 22*b* and the side wall 22*a* side of the inner frame 22 to perform molding. When the molded products are to be released from the metal molds, the metal frames are slid in directions A and B, respectively (FIG. 11), thereby forming the opening path 23. Shaft holes 25 and 26 are provided for the outer case 16 and the inner frame 22, and retaining cylinders 28 and 29 having flanges 27 are inserted in the shaft holes 25 and 26, respectively. Hence, cylinder holes 30 and 31 of the retaining cylinders 28 and 29 are defined by the cylinder walls (insulating cylinder walls) of the retaining cylinders 28 and 29.

Figure 6:
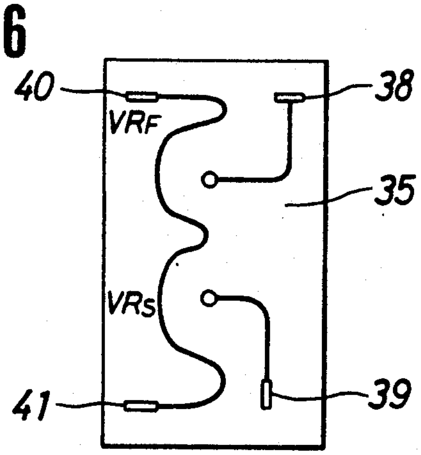
FIG. 6 shows a resistor circuit on a circuit board incorporated in the focus pack.
Figure 7:
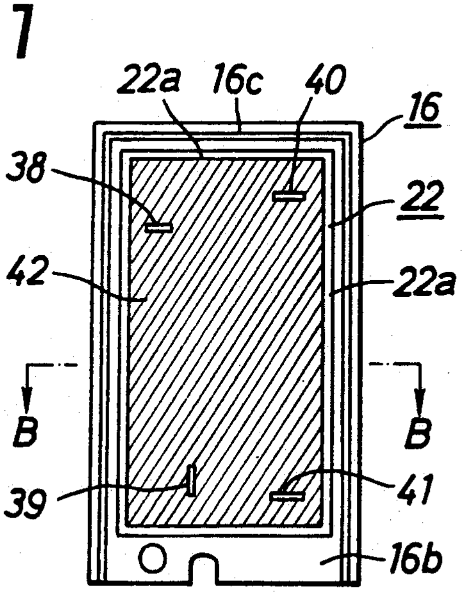
FIG. 7 is a plan view of the focus pack of the flyback transformer according to the present invention when viewed from the side of the open flat surface.
Figure 8:
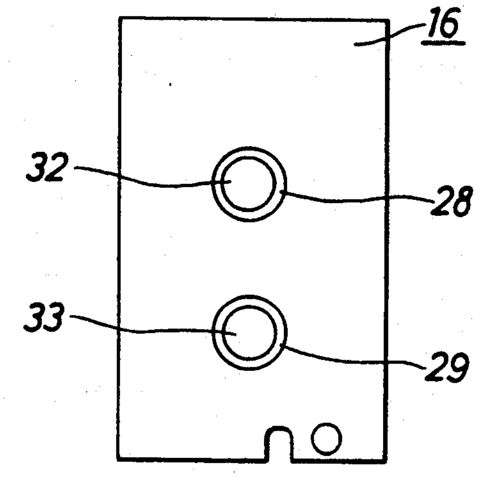
FIG. 8 is a rear view of the focus pack shown in FIG. 7.
Figure 9:
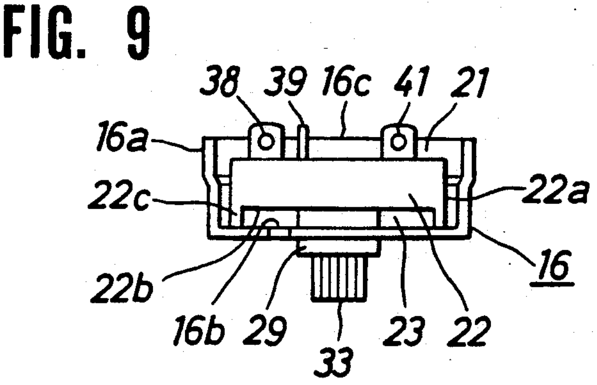
FIG. 9 is a bottom view of the focus pack shown in FIG. 7.
Figure 10:
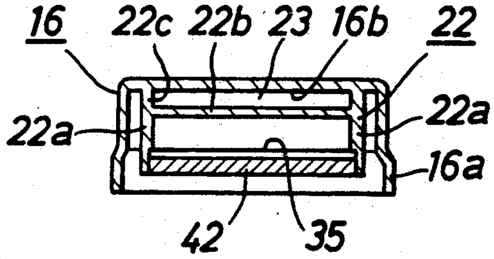
FIG. 10 is a sectional view taken along the line B—B of FIG. 7.

A focus rotational operation shaft 32 for focus voltage adjustment is rotatably fitted in the cylinder hole 30 of the retaining cylinder 28, and a screen rotational operation shaft 33 for screen voltage adjustment is rotatably inserted in the cylinder hole 31 of the retaining cylinder 29. The circuit board 35 is mounted on the opening flat surface side of the inner frame 22. The resistor circuit (not shown) including focus variable resistor $VR_F$ for changing the focus voltage and the screen variable resistor $VR_S$ for changing the screen voltage are formed on the circuit board 35, as shown in FIG. 6. A slider 36 for sliding on the focus variable resistor $VR_F$ is provided on the bottom of the focus rotational operation shaft 32, and a slider 37 for sliding on the screen variable resistor $VR_S$ is provided on the bottom of the screen rotational operation shaft 33. When the focus rotational operation shaft 32 is rotated, the slider 36 slides on the focus variable resistor $VR_F$ to change the focus voltage. Similarly, the screen voltage can be variably adjusted by rotating the screen rotational operation shaft 33. A focus voltage output terminal 38 for outputting the focus voltage, a screen voltage output terminal 39 for outputting the screen voltage, an input terminal 40 for supplying a high voltage from the high-voltage coil 13 to the resistor circuit and a ground terminal 41 of the resistor circuit are provided on the remaining surface of the circuit board 35. The surface of the circuit board 35 on which these terminals 38 to 41 are provided, excluding lead connecting portions of the respective terminals, is covered with an insulating resin 42.

The focus pack 100 having the above arrangement is mounted on the transformer case 14 of the flyback transformer by fitting the fitting portion 16*a* of the outer case 16 on the mounting portion of the transformer case 14, as shown in FIG. 4. In this state, the insulating casting resin 8 such as an epoxy resin is injected into the transformer case 14. Then, the insulating casting resin 8 flows into the opening path 23. The circuit board 35 is insulated from the outside by the inner frame 22. Consequently electrical discharge from the high-voltage portion of the resistor circuit to the outside is reliably prevented. As the insulating casting resin 8 flowing into the opening path 23 is defined by the retainer cylinders 28 and 29, it does not flow into the cylinder holes 30 and 31 and hence does not interfere with the rotating operation of the focus rotational operation shaft 32 and the screen rotational operation shaft 33. A partition 43 blocks the insulating casting resin 8 from entering into the cylinder holes 30 and 31. When the circuit board 35 is inserted in the inner frame 22, the partition 43 supports it to be kept at a predetermined gap from the bottom 22*b* of the inner frame 22.

As described above, the outer case 16 and the inner frame 22 of the focus pack 100 are integrally formed by a single mold in a single formation step. The cumbersome work steps of apparatuses conventionally proposed, i.e., forming the outer and inner cases 2 and 3 in separate steps by using separate molds and then integrating the cases 2 and 3 by fitting them, can be omitted. As a result, workability of the manufacture of the apparatus is greatly improved, and the manufacturing cost is decreased.

In this embodiment, the inner frame 22 is integrally formed inside the outer case 16, unlike in the conventional apparatus in which the cases 2 and 3 are fitted to obtain a double structure. In the conventionally proposed apparatuses, the two types of cases 2 and 3 having different sizes are fitted. Compared to this, the size and shape of each fitting portion with respect to the transformer case can be more easily made identical to those of the existing focus pack which is formed of a single outer case. As a result, the focus pack of this embodiment can be mounted in an existing flyback transformer, and the conventional flyback transformer having the focus pack can be easily replaced by a flyback transformer having the focus pack of this embodiment.

Figure 13:
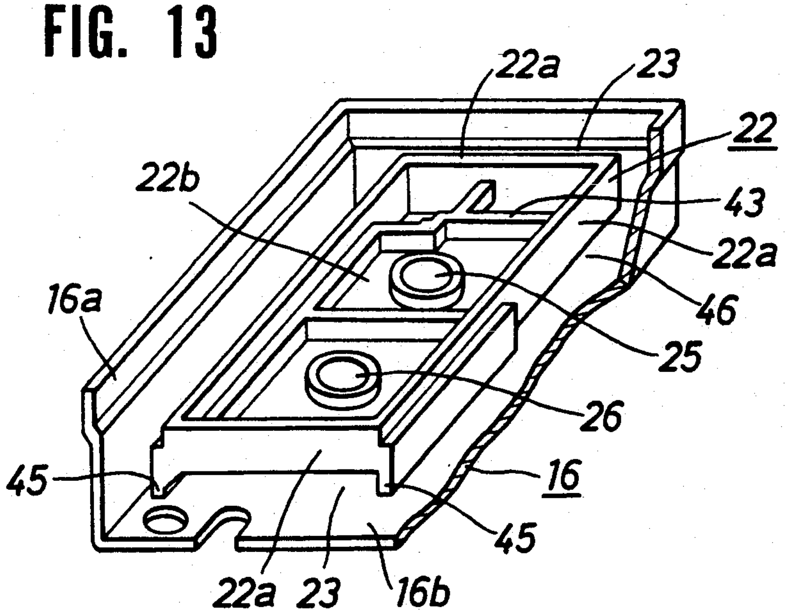
FIG. 13 is an exploded perspective view of another embodiment of the focus pack.

FIG. 13 is a perspective view of a focus pack constituting a second embodiment of the flyback transformer according to the present invention. The second embodiment is different from the first embodiment in the following respects. A side wall pillar 45 of an inner frame 22, that couples an outer case 16 and the inner frame 22 of a focus pack 100, is not formed in the entire region of the side wall 22*a* of the inner frame 22 in the longitudinal direction. Rather, the side wall pillar 45 is provided to extend from an end portion of the side wall 22*a* to a substantially intermediate position, and the side wall pillar 45 is not formed in the remaining region extending from the substantially intermediate portion to the other end portion of the side wall 22*a*. Hence, a complete space 46 is provided between the bottom 22*b* of the inner frame 22 and the bottom 16*b* of the outer case 16. As the space 46 is formed in this manner, contact between the bottom of the inner frame 22 and the outer case 16 is avoided on the side of the circuit board where the input terminal 40 is provided, and the creeping distance on the input terminal 40 side, to which the high voltage is applied, against the outside can be further increased. As a result, electrical discharge from the input terminal 40 is further prevented.

The present invention is not limited to the embodiments described above but can be modified in various manners. For example, in the embodiments described above, the focus pack 100 is mounted on the transformer case 14, and thereafter the transformer case 14 is filled with the insulating casting resin 8 to flow into the opening path 23. However, injection of the insulating casting resin 8 into the opening path 23 can be performed prior to mounting of the focus pack 100 to the transformer case 14 of the flyback transformer. The insulating resin 42 to cover the circuit board 35 can be replaced by the insulating casting resin 8. Then, insulating coverage is performed simultaneously when the insulating casting resin 8 is charged into the opening path 23.

According to the present invention, the outer case and the inner frame are integrally formed to constitute the focus pack. Therefore, the outer case and the inner frame can be integrally formed in a single formation step by using a single mold. As a result, compared to the method of the conventionally proposed apparatuses in which the outer and inner cases are formed in separate steps by using separate molds and are fitted to each other in the assembly step, the manufacturing work efficiency is greatly improved while the cost is greatly decreased.

According to the present invention, the high-voltage portion of the circuit board housed in the inner frame is insulated from the outside by the inner frame, the insulating resin injected in the opening path, and the outer case. Therefore, the dielectric strength of the high-voltage portion is increased, and electrical discharge from the circuit board to the outside can be reliably prevented.

What is claimed is:

1. A flyback transformer with a focus pack mounted on a transformer case, said focus pack arranging a circuit board having a resistor circuit including a variable resistor for focus voltage supply mounted thereon comprising:

an outer case mounted on said transformer case, and an inner frame formed inside and integrally with said outer case for incorporating said circuit board;

an opening path formed between said outer case and said inner frame to be continuous from a side of said inner frame to a bottom thereof;

a shaft hole extending through said outer case and said inner frame, a retaining cylinder adapted to be inserted into said shaft hole; and a rotatable operation shaft adapted to be arranged into a cylinder hole.

2. A flyback transformer according to claim 1, wherein said resistor circuit has another variable resistor for screen voltage supply formed therein, another shaft hole is provided extending through said outer case and said inner frame and is defined by an insulating cylinder wall, and another rotatable operation shaft of said another variable resistor inserts into the cylinder hole of said insulating cylinder wall.

3. A flyback transformer according to claim 1 wherein a side wall pillar supporting said inner frame on said outer case extends to the halfway of said side wall of said inner case.

4. A focus pack comprising an outer case and an inner frame; a supporting member integrally formed between said outer case and inner frame; a circuit board housed in said inner case and having a resistor circuit formed thereon; a shaft hole extending through said outer case and inner frame; an insulating cylinder passing through said shaft hole; a rotatable shaft arranged into said insulating cylinder; and an electrically insulating resin member injected into and cured in open spaces of said outer and inner cases.

5. A method for forming a flyback transformer comprising:

providing a transformer case;

integrally forming an outer case and inner frame, to produce an integral structure, said integral structure defining a path between said outer case and said inner frame and also defining at least one shaft hole extending through said outer case and said inner frame;

mounting a circuit board on said integral structure;

mounting said integral structure on said transformer case; and positioning a rotatable operation shaft in said shaft hole.

6. A method, as claimed in claim 5, further comprising flowing casting resin into said path to provide electrical insulation between at least a portion of said inner frame and said outer case.

* * * * *